United States Patent
Fauer et al.

(10) Patent No.: US 9,203,296 B2
(45) Date of Patent: Dec. 1, 2015

(54) POWER SUPPLY SYSTEMS WITH FILTERS

(71) Applicant: ASTEC INTERNATIONAL LIMITED, Kowloon (HK)

(72) Inventors: Franz Karl Fauer, Vienna (AT); Martin Karl Fusser, Gresten (AT)

(73) Assignee: ASTEC INTERNATIONAL LIMITED, Kwun Tong, Kowloon (HK)

( * ) Notice: Subject to any disclaimer, the term of this patent is extended or adjusted under 35 U.S.C. 154(b) by 231 days.

(21) Appl. No.: 13/799,810

(22) Filed: Mar. 13, 2013

(65) Prior Publication Data

US 2014/0266507 A1    Sep. 18, 2014

(51) Int. Cl.
| | |
|---|---|
| H02M 1/12 | (2006.01) |
| H03H 7/01 | (2006.01) |
| H03H 1/00 | (2006.01) |
| H02M 1/10 | (2006.01) |
| H03H 7/42 | (2006.01) |
| H01F 17/00 | (2006.01) |

(52) U.S. Cl.
CPC ............... *H02M 1/126* (2013.01); *H02M 1/10* (2013.01); *H03H 1/0007* (2013.01); *H03H 7/0115* (2013.01); *H03H 7/427* (2013.01); H01F 2017/0093 (2013.01); H02M 2001/123 (2013.01)

(58) Field of Classification Search
CPC ..... H03H 1/0007; H03H 7/0115; H02M 5/04; H02M 2001/123; H01F 2017/0093
USPC ............... 333/181; 307/26, 65; 361/139, 271; 323/355
See application file for complete search history.

(56) References Cited

U.S. PATENT DOCUMENTS

| | | | |
|---|---|---|---|
| 4,677,401 A | | 6/1987 | Nonaka et al. |
| 4,725,739 A | * | 2/1988 | McCartney et al. ............ 307/35 |
| 5,061,913 A | | 10/1991 | Okochi et al. |
| 5,825,259 A | | 10/1998 | Harpham |
| 6,751,106 B2 | | 6/2004 | Zhang et al. |
| 6,917,271 B2 | | 7/2005 | Zhang et al. |
| 7,888,819 B2 | | 2/2011 | Lee |
| 2004/0160789 A1 | * | 8/2004 | Ying et al. ...................... 363/16 |

FOREIGN PATENT DOCUMENTS

| | | |
|---|---|---|
| CN | 202068186 | 12/2011 |
| JP | 2007-300700 | 11/2007 |

OTHER PUBLICATIONS

JP 2007-300700-A (English Translation); Nov. 2007.*

* cited by examiner

*Primary Examiner* — Benny Lee
*Assistant Examiner* — Rakesh Patel
(74) *Attorney, Agent, or Firm* — Harness, Dickey & Pierce, P.L.C.

(57) ABSTRACT

A filter for a power supply includes at least two inputs, at least two outputs, and a common mode choke coupled between the at least two inputs and the at least two outputs. Each input includes a pair of input terminals and each output includes a pair of output terminals. The common mode choke includes a magnetic core and at least four windings extending about the magnetic core. Each winding is coupled between one of the input terminals and one of the output terminals. The filter may further include X-capacitors coupled between the at least two inputs and the at least two outputs. Also disclosed are power supply systems including one or more power supplies and a filter coupled to the power supplies.

27 Claims, 13 Drawing Sheets

POWER SUPPLY SYSTEMS WITH FILTERS

FIELD

The present disclosure relates to power supply systems with filters, including input and output filters for power supply systems.

BACKGROUND

This section provides background information related to the present disclosure which is not necessarily prior art.

Power supply systems frequently include filters to block common mode noise and differential mode noise. In many cases, these filters are required to satisfy emission and immunity EMC requirements. Common mode noise includes noise on a return path and a supply path in the same direction referenced to a reference voltage (e.g., ground or another suitable reference potential) while differential mode noise includes noise on the return path and the supply path in opposite directions. The filters may include components (e.g., capacitors, differential mode chokes, common mode chokes, etc.) to block the differential mode noise and the common mode noise. For example, the main inductance of a common mode choke may assist in blocking the common mode noise while a stray (i.e., a leakage) inductance of the common mode choke may assist in blocking the differential mode noise.

FIG. 1 illustrates a power supply system according to the prior art. As shown in FIG. 1, the system includes a DC-DC switched mode power supply and an input filter having two inputs (i.e., Input A and Input B) and two outputs (i.e., Output A and Output B). The input of the power supply is coupled to the outputs of the filter. The filter includes X- and Y-capacitors 102a, 102b and common mode chokes 104a, 104b. Each common mode choke 104a, 104b includes windings 106a, 106b, 108a, 108b extending about a magnetic core 110a, 110b.

As recognized by the present inventors, the power supply system shown in FIG. 1 may experience varying conducted emissions (i.e., common mode noise), resulting in undesirable EMC performance, depending on whether the filter inputs (Input A and Input B) are coupled to separate power sources, to reference voltage(s), and/or to each other. For example, the undesirable EMC performance may be caused by the sum of the DC fluxes of the common mode chokes 104a, 104b not being zero. This in turn may cause common mode chokes 104a, 104b to saturate which then causes a main inductance of the common mode chokes 104a, 104b to decrease.

FIG. 2 illustrates another power supply system according to the prior art. As shown in FIG. 2, the system includes a DC-DC switched mode power supply and an input filter 200 having two inputs (i.e., Input A and Input B) and a single output coupled to the input of the power supply. The filter 200 includes X- and Y-capacitors 202 and common mode chokes 204a, 204b having windings extending about magnetic cores 210a, 210b.

As recognized by the present inventors, the power supply system shown in FIG. 2 may experience undesirable filtering due to increased distances between the inputs A, B and the X- and Y-capacitors 202. For example, the distances may be increased due components (e.g., fuses, metal oxide varistors (Mov), reverse current protection devices, etc.) coupled between the inputs A, B and the X- and Y-capacitors 202. In some cases, the increased distances (and traces for the components) may cause noise to bypass the X- and Y-capacitors 202 and the common mode chokes 204a, 204b resulting in undesirable filtering.

SUMMARY

This section provides a general summary of the disclosure, and is not a comprehensive disclosure of its full scope or all of its features.

According to one aspect of the present disclosure, a filter for a power supply includes at least two inputs, at least two outputs, and a common mode choke coupled between the at least two inputs and the at least two outputs. Each input includes a pair of input terminals and each output includes a pair of output terminals. The common mode choke includes a magnetic core and at least four windings extending about the magnetic core. Each winding is coupled between one of the input terminals and one of the output terminals.

According to another aspect of this disclosure, a system includes a power supply and an input filter. The power supply includes an input. The input filter has at least two inputs, at least two outputs, and a common mode choke coupled between the at least two inputs and the at least two outputs. Each input of the input filter includes a pair of input terminals and each output includes a pair of output terminals. The common mode choke includes a magnetic core and at least four windings extending about the magnetic core. Each winding is coupled between one of the input terminals and one of the output terminals of the input filter. At least one of the outputs of the input filter is coupled to the input of the power supply.

According to yet another aspect of this disclosure, a system includes a power supply and an output filter. The power supply includes an output. The output filter has at least two inputs, at least two outputs, and a common mode choke coupled between the at least two inputs and the at least two outputs. Each input includes a pair of input terminals and each output of the output filter includes a pair of output terminals. The common mode choke includes a magnetic core and at least four windings extending about the magnetic core. Each winding is coupled between one of the input terminals and one of the output terminals of the output filter. At least one of the inputs of the output filter is coupled to the output of the power supply.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
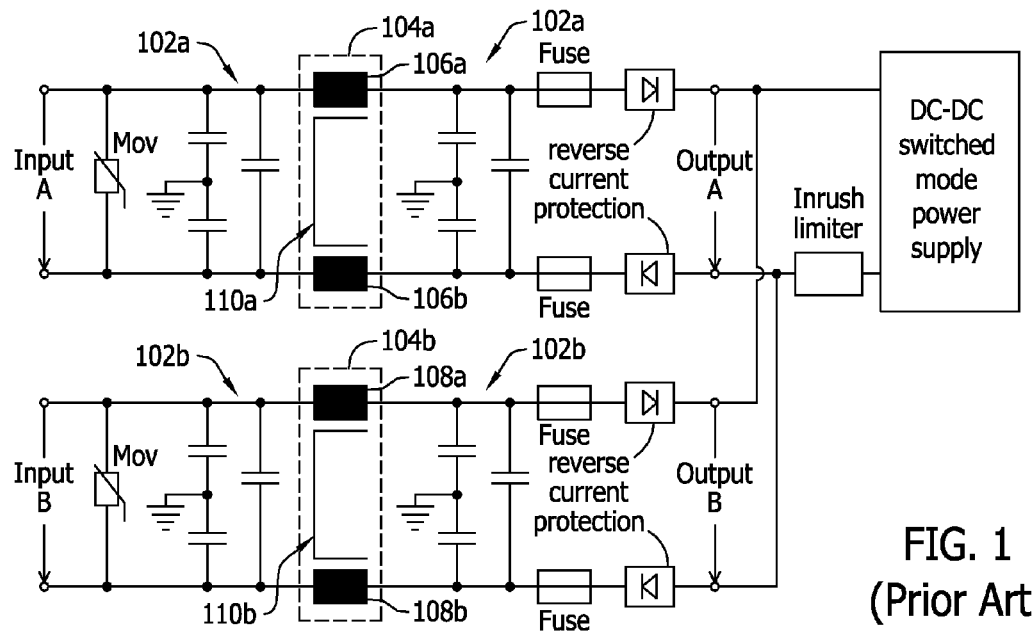
FIG. 1 illustrates a power supply system according to the prior art.
Figure 2:
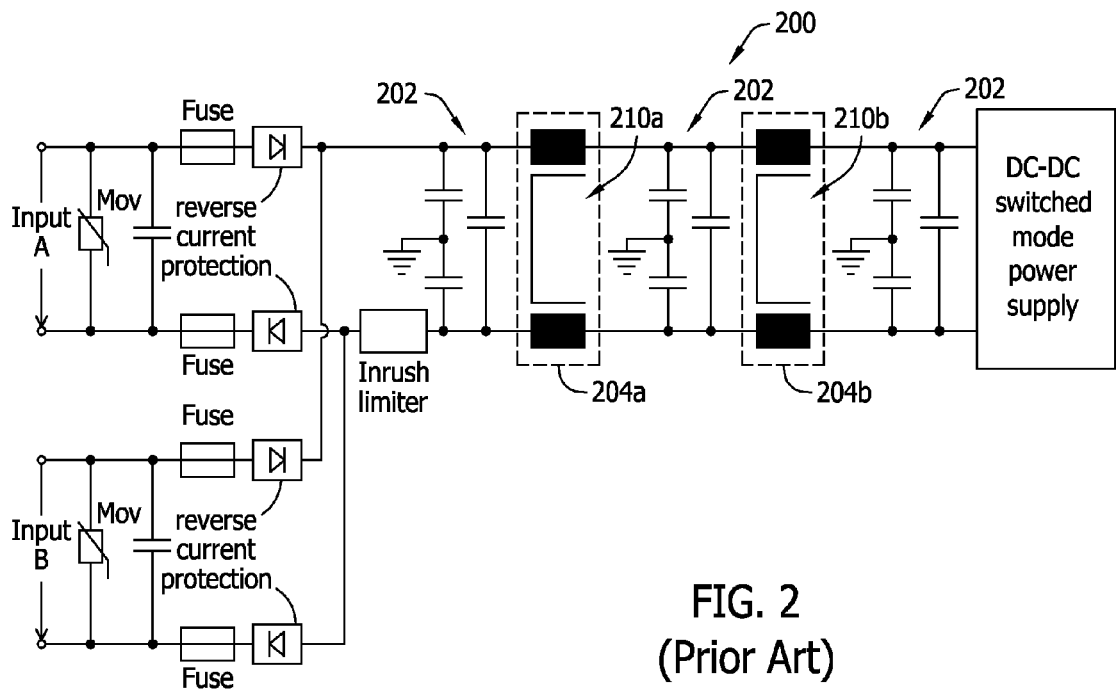
FIG. 2 illustrates another power supply system according to the prior art.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 3:
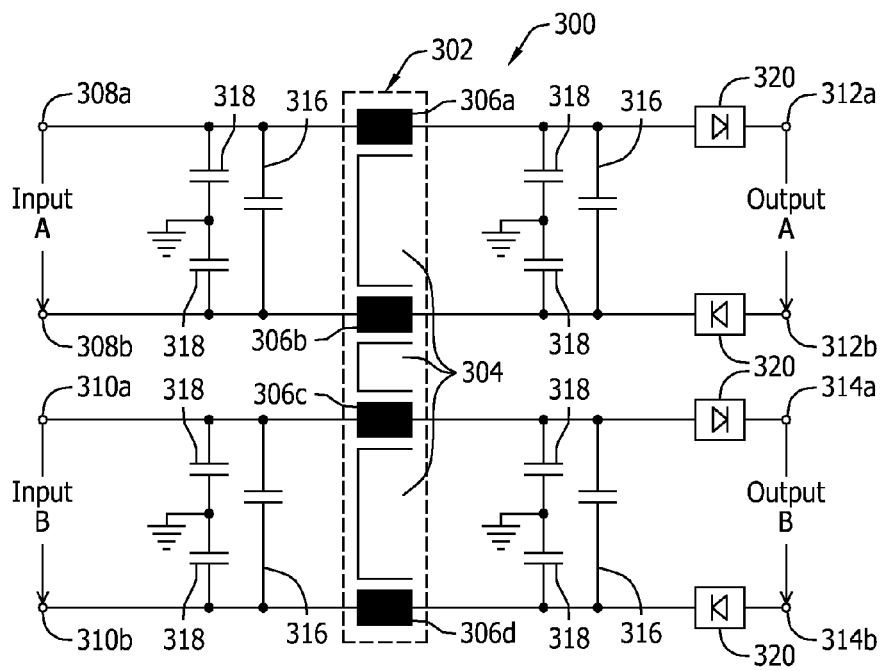
FIG. 3 is a circuit diagram of a filter having a common mode choke according to one example embodiment of the present disclosure.

A filter for a power supply according to one example embodiment of the present disclosure is illustrated in FIG. 3 and indicated generally by reference number 300. As shown in FIG. 3, the filter 300 includes two inputs (Input A and Input B), two outputs (Output A and Output B), and a common mode choke 302 coupled between the two inputs and the two outputs. Each input includes a pair of input terminals 308a, 308b, 310a, 310b and each output includes a pair of output terminals 312a, 312b, 314a, 314b.

The common mode choke 302 includes a magnetic core 304 and at least four windings 306a, 306b, 306c, 306d extending about the magnetic core 304. The common mode chokes disclosed herein are sometimes referred to as "combined common mode chokes."

Each winding is coupled between one of the input terminals and one of the output terminals. For example, as shown in FIG. 3, the winding 306a is coupled between the input terminal 308a and the output terminal 312a, the winding 306b is coupled between the input terminal 308b and the output terminal 312b, the winding 306c is coupled between the input terminal 310a and the output terminal 314a and the winding 306d is coupled between the input terminal 310b and the output terminal 314b.

By having the windings 306a, 306b, 306c, 306d share the magnetic core 304, DC currents flowing through two of the windings (e.g., windings 306a, 306b) are offset by DC currents flowing through two of the other windings (e.g., windings 306c, 306d). The DC currents flowing through the other two windings may depend, for example, on whether the inputs A, B are coupled to separate power sources, to reference voltage(s), and/or to each other. Because the DC currents are offset, the sum of the DC fluxes of the combined common mode choke 302 is zero. Therefore, the combined common mode choke 302 does not saturate and the main inductance of the combined common mode choke 302 is maintained. This may result in desirable EMC performance.

In the example of FIG. 3, the filter 300 further includes X-capacitors 316 coupled between the input terminals 308a, 308b of input A and the output terminals 312a, 312b of output A. Additionally, the filter 300 includes Y-capacitors 318 coupled between one of the input terminals 308a, 308b of input A and a reference voltage (e.g., ground or another suitable reference potential) and one of the output terminals 312a, 312b of the output A and the reference voltage. As shown in FIG. 3, the X-capacitors 316 and the Y-capacitors 318 are also coupled in a like manner between input terminals and output terminals of the output B.

In operation, the X-capacitors 316 and a stray inductance from the combined common mode choke 302 are configured to short circuit (i.e., damp) differential mode noise in the filter 300. The Y-capacitors 318 and a main inductance of the combined common mode choke 302 are configured to short circuit (i.e., damp) common mode noise in the filter 300 to the reference voltage.

In the particular example of FIG. 3, the filter 300 may further include a reverse current protection device 320 coupled between the input terminals 308a, 308b, 310a, 310b and the output terminals 312a, 312b, 314a, 314b, respectively. As shown in FIG. 3, the reverse current protection devices 320 are coupled on an output side of the combined common mode choke 302. Alternatively, and as further described below, the reverse current protection devices 320 may be coupled on an input side of the combined common mode choke 302. Additionally, although the example of FIG. 3 illustrates the reverse current protection device 320 as including a diode, the reverse current protection device 320 may include any other suitable device for reverse current protection including, for example, an ORing device including MOSFETs.

The reverse current protection devices 320 may open circuit (i.e., OFF) or short circuit (i.e., ON) the input terminals 308a, 308b, 310a, 310b depending on whether the inputs A, B are coupled to separate power sources, to reference voltage(s), and/or to each other. In some configurations, the reverse current protection devices 320 of the input A are off while the reverse current protection devices 320 of the input B are on. This allows common mode current from the input B and/or the output B to flow through the windings 306c, 306d of the combined common mode choke 302 and the Y-capacitors 318 of the input B to the reference voltage. However, because the windings 306a, 306b, 306c, 306d share the magnetic core 304, the combined common mode choke 302 acts as a transformer from one input to another input. Therefore, the common mode current from the input B and/or the output B may also flow through the windings 306a, 306b and the Y-capacitors 318 of the input A to the reference voltage causing the combined common mode choke 302 to act as a loaded transformer. This common mode current flowing in input A from input B is referred to as a transformed common mode current.

The transformed common mode current flowing in the windings 306a, 306b of the input A generates a flux in the magnetic core 304 that acts against a flux generated by the common mode current flowing in the windings 306c, 306d of the input B. This may decrease the main inductance of the combined common mode choke 302 and thus results in undesired performance of the filter 300.

Figure 4:
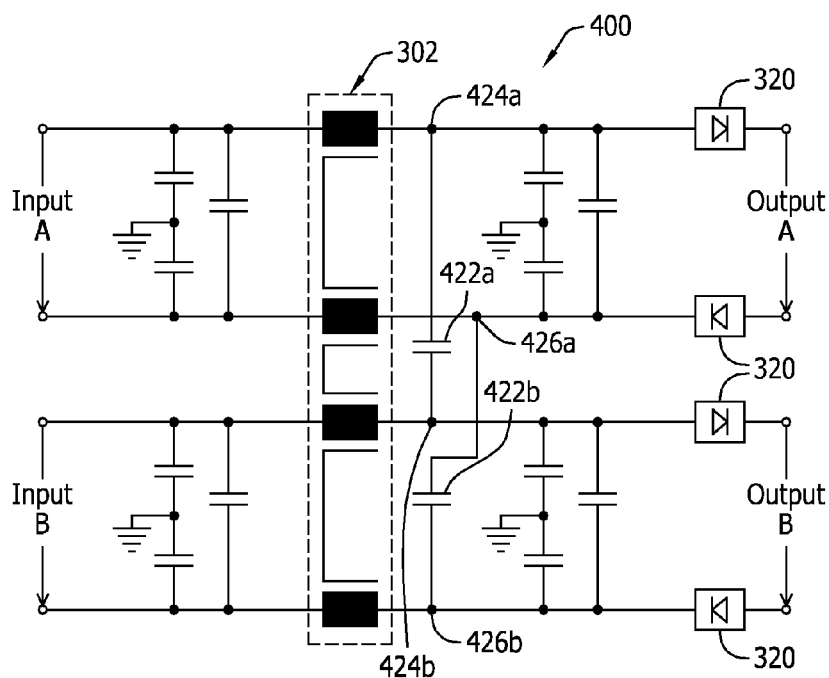
FIGS. 4-5 are circuit diagrams of filters having common mode chokes according to additional example embodiments.

To overcome this, additional paths for the common mode currents may be employed. For example, FIG. 4 illustrates a filter 400 including capacitors 422a, 422b for providing these additional paths. Although the capacitors 422a, 422b may carry some common mode current (further explained below), they are herein referred to as X-capacitors 422a, 422b because they are coupled between return paths and/or supply paths and not to a reference voltage.

As shown in FIG. 4, the X-capacitors 422a, 422b include terminals 424a, 424b and 426a, 426b, respectively. The terminal 424a of the X-capacitor 422a and the terminal 426a of the X-capacitor 422b are coupled between the input A and the output A, and the terminal 424b of the X-capacitor 422a and the terminal 426b of the X-capacitor 422b are coupled between the input B and the output B.

In the example of FIG. 4, the X-capacitors 422a, 422b are coupled between the combined common mode choke 302 and the outputs A, B. Preferably, when one or more of the outputs A, B are coupled to a noise source (e.g., one or more power supplies), the X-capacitors 422a, 422b are coupled between the combined common choke 302 and the reverse current protection devices 320.

These additional paths created by the X-capacitors 422a, 422b allow current to flow via X-capacitors 422a, 422b to compensate for the transformed common mode current. This allows the common mode currents to have the same amplitude and phase while flowing through the windings 306a, 306b, 306c, 306d to the reference voltage via the Y-capacitors of the inputs A, B regardless of the state (i.e., on or off) of the reverse current protection devices 320. Thus, for common mode currents, the X-capacitors 422a, 422b may bridge the reverse current protection devices 320 that are off.

In this way, the X-capacitors 422a, 422b ensure minimal transformed common mode current from input B flows through the windings 306a, 306b and the Y-capacitors 318 of input A to the reference voltage when, for example, the reverse current protection devices 320 of the input A are off and the reverse current protection devices 320 of the input B are on. Thus, the combined common mode choke 302 having the common magnetic core 304 does not act as a loaded transformer. Accordingly, the main inductance of the combined common mode choke 302 is maintained resulting in a desired EMC performance of the filter 400.

Figure 5:
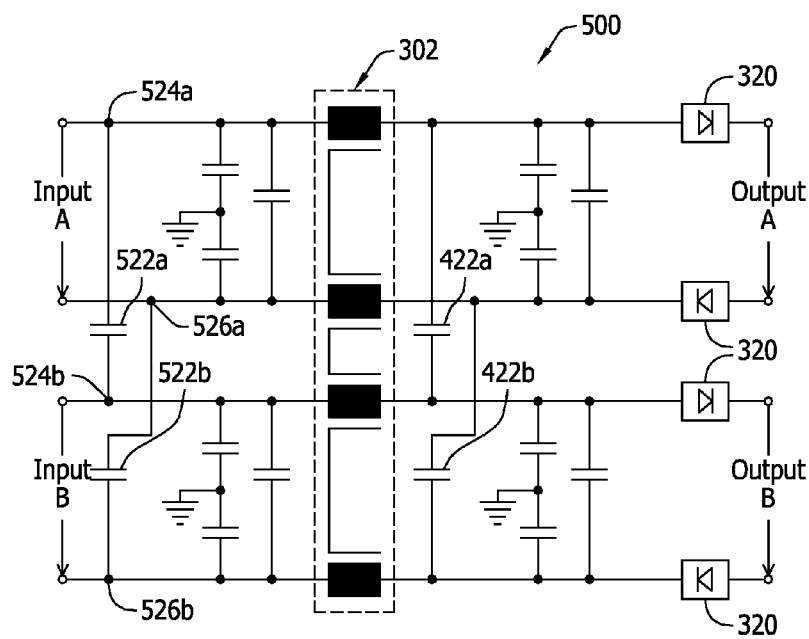

FIG. 5 illustrates an example filter 500 including X-capacitors 522a, 522b coupled on the input side of the combined common mode choke 302 and the X-capacitors 422a, 422b (described above) coupled on the output side of the combined common mode choke 302. The X-capacitors 522a, 522b include terminals 524a, 524b and 526a, 526b, respectively. The terminal 524a of the X-capacitor 522a and the terminal 526a of the X-capacitor 522b are coupled between the input A and the combined common mode choke 302, and the terminal 524b of the X-capacitor 522a and the terminal 526b of the X-capacitor 522b are coupled between the input B and the combined common mode choke 302.

Current flowing through the X-capacitors 422a, 422b may compensate for unsymmetrical common mode noise levels (i.e., having a different amplitude and/or phase) between the combined common mode choke 302 and the reverse current protection devices 320 if a noise source is coupled to the inputs A, B and/or the outputs A, B. The unsymmetrical common mode noise levels may be caused, for example, by tolerances of components in the filter 500 including different resistances of the reverse current protection devices 320 (if ORing devices including MOSFETs are employed), noise from components surrounding the filter 500, an unsymmetrical layout of the filter 500, etc. The unsymmetrical common mode noise levels may occur, for example, if not all reverse current protection devices 320 are conducting and a noise source is coupled to the outputs A, B (as explained above).

The X-capacitors 522a, 522b may assist in ensuring the combined common mode choke 302 does not act as a loaded transformer (as explained above) for noise coupled on the inputs A, B.

Further, the X-capacitors 522a, 522b may reduce conducted and/or radiated emissions (e.g., from a noise source coupled to the outputs A, B) by compensating for unsymmetrical common mode noise levels at the inputs A, B as explained above. This allows the common mode noise levels on the inputs A, B to be symmetrical (i.e., having the same amplitude and phase). Thus, the X-capacitors 522a, 522b assist in providing a symmetrical noise path at the inputs A, B.

Figure 6:
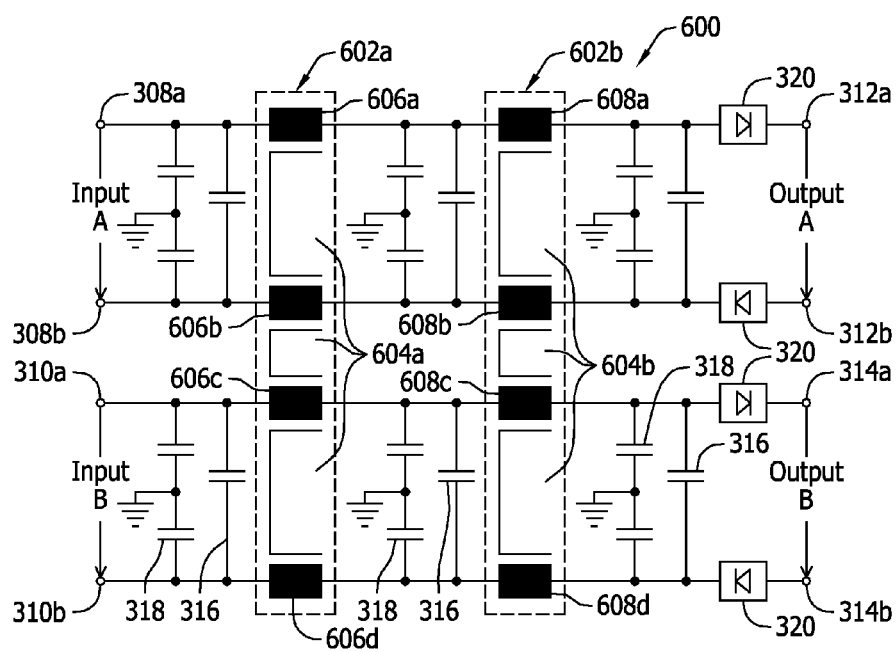
FIGS. 6-8 are circuit diagrams of filters having two common mode chokes according to further example embodiments.

FIG. 6 illustrates another example filter 600 including combined common mode chokes 602a, 602b. The combined common mode choke 602a includes a magnetic core 604a and four windings 606a, 606b, 606c, 606d extending about the magnetic core 604a. Similarly, the combined common mode choke 602b includes a magnetic core 604b and four windings 608a, 608b, 608c, 608d extending about the magnetic core 604b. The combined common mode chokes 602a, 602b include the same advantages as the combined common mode choke 302 described above with reference to FIG. 3

As shown in FIG. 6, the windings 606a, 608a are coupled between input terminal 308a of input A and output terminal 312a of output A while the windings 606b, 608b are coupled between input terminal 308b of input A and output terminal 312b of output A. Further, the windings 606c, 608c are coupled between input terminal 310a of input B and output terminal 314a of output B while the windings 606d, 608d are coupled between input terminal 310b of input B and output terminal 314b of output B.

In the example of FIG. 6, the filter 600 further includes the X-capacitors 316, the Y-capacitors 318 and the reverse current protection devices 320 as described above with reference to FIG. 3.

The filter 600 may include the same advantages and possible undesired performance (e.g., from reduced main inductance in the combined common mode chokes 602a, 602b) as explained above with reference to FIG. 3.

Figure 7:
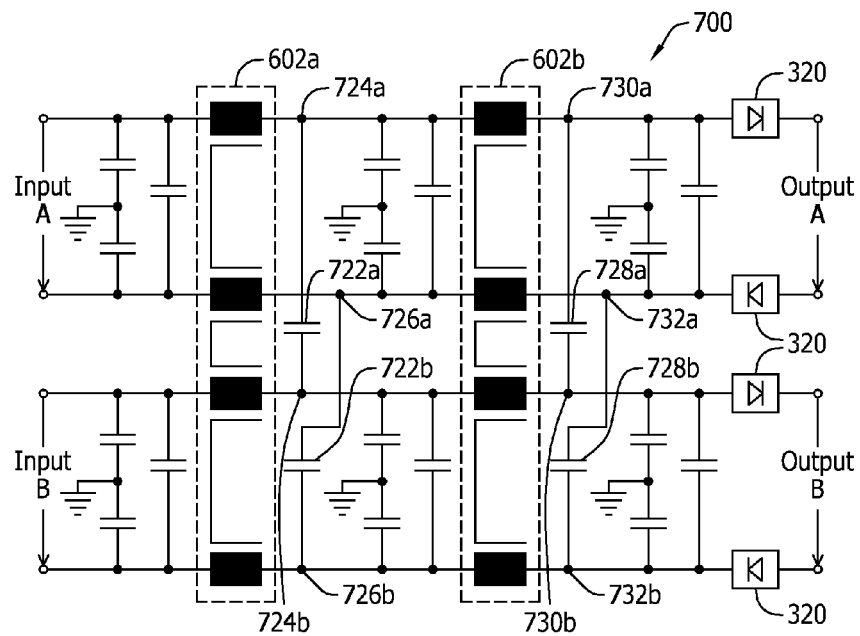

To overcome this, X-capacitors (as described above) may be employed to provide additional paths for common mode currents. FIG. 7 illustrates one example embodiment of a filter 700 including X-capacitors 722a, 722b, 728a, 728b and the combined common mode chokes 602a, 602b of FIG. 6.

As shown in the example of FIG. 7, the X-capacitors 722a, 722b are coupled between the combined common mode chokes 602a, 602b and the X-capacitors 728a, 728b are coupled on the output side of the combined common mode choke 602b. The X-capacitors 722a, 722b include terminals 724a, 724b and 726a, 726b, respectively, and the X-capacitors 728a, 728b include terminals 730a, 730b and 732a, 732b, respectively. The terminals 724a, 726a, 730a, 732a are coupled between the input A and the output A and the terminals 724b, 726b, 730b, 732b are coupled between the input B and the output B.

The X-capacitors 728a, 728b may bridge the reverse current protection devices 320 for common mode currents as explained above. This may ensure the combined common mode choke 602b does not act as a loaded transformer if a noise source is coupled to the outputs A, B. Accordingly, the main inductance of the combined common mode choke 602b is maintained.

Additionally, the X-capacitors 728a, 728b may compensate for unsymmetrical common mode noise levels. In this way, the X-capacitors 728a, 728b provide a symmetrical noise path between the combined common mode choke 602b and the reverse current protection devices 320 if a noise source is coupled to the inputs A, B and/or the outputs A, B as described above with reference to the X-capacitors 422a, 422b of FIGS. 4 and 5.

Further, the X-capacitors 722a, 722b may assist in providing a symmetrical noise path between the combined common mode chokes 602a, 602b by allowing current to flow through the X-capacitors 722a, 722b to compensate for unsymmetrical common mode noise levels as explained above. This allows the common mode noise levels between the combined common mode chokes 602a, 602b to be symmetrical. The symmetrical common mode noise ensures the combined common mode chokes 602a, 602b do not act as a loaded transformer if a noise source is coupled to the inputs A, B and/or the outputs A, B.

Figure 8:
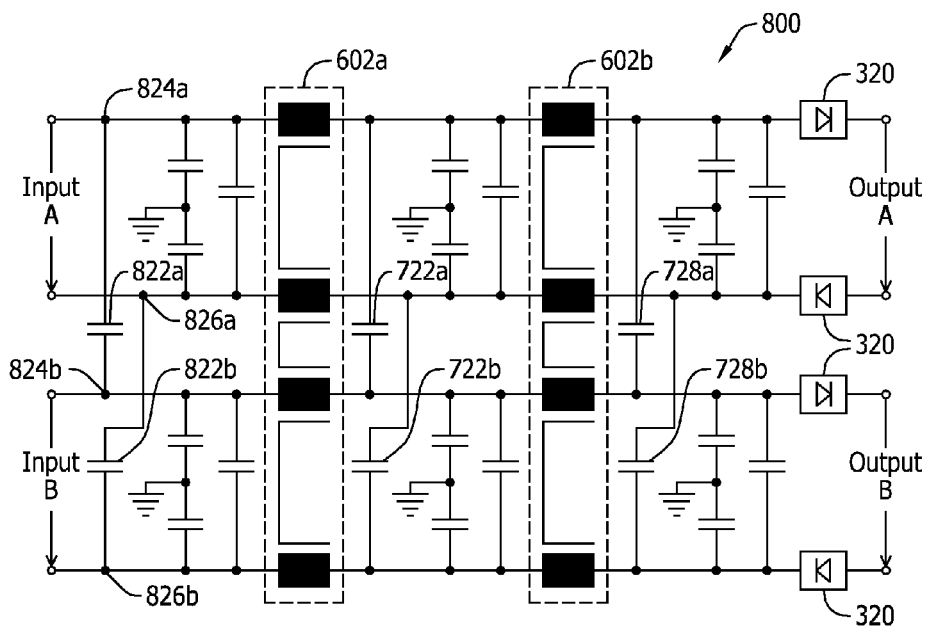

FIG. 8 illustrates another example filter 800 including the combined common mode chokes 602a, 602b and the X-capacitors 722a, 722b, 728a, 728b of FIG. 7 and additional X-capacitors 822a, 822b having terminals 824a, 824b and terminals 826a, 826b, respectively. As shown in FIG. 8, the terminal 824a of the X-capacitor 822a and the terminal 826a of the X-capacitor 822b are coupled between the input A and the combined common mode choke 602a, and the terminal 824b of the X-capacitor 822a and the terminal 826b of the X-capacitor 822b are coupled between the input B and the combined common mode choke 602a.

The X-capacitors 722a, 722b, 728a, 728b include the same advantages as described above with reference to FIG. 7. The X-capacitors 822a, 822b include the same advantages as described above with reference to the X-capacitors 522a, 522b of FIG. 5.

FIGS. 9-13 illustrate the filter 700 of FIG. 7 coupled to a DC-DC switched mode power supply 902. As shown in FIGS. 9-13, the filter 700 is an input filter for the DC-DC switched mode power supply 902 which may be a noise source.

Figure 9:
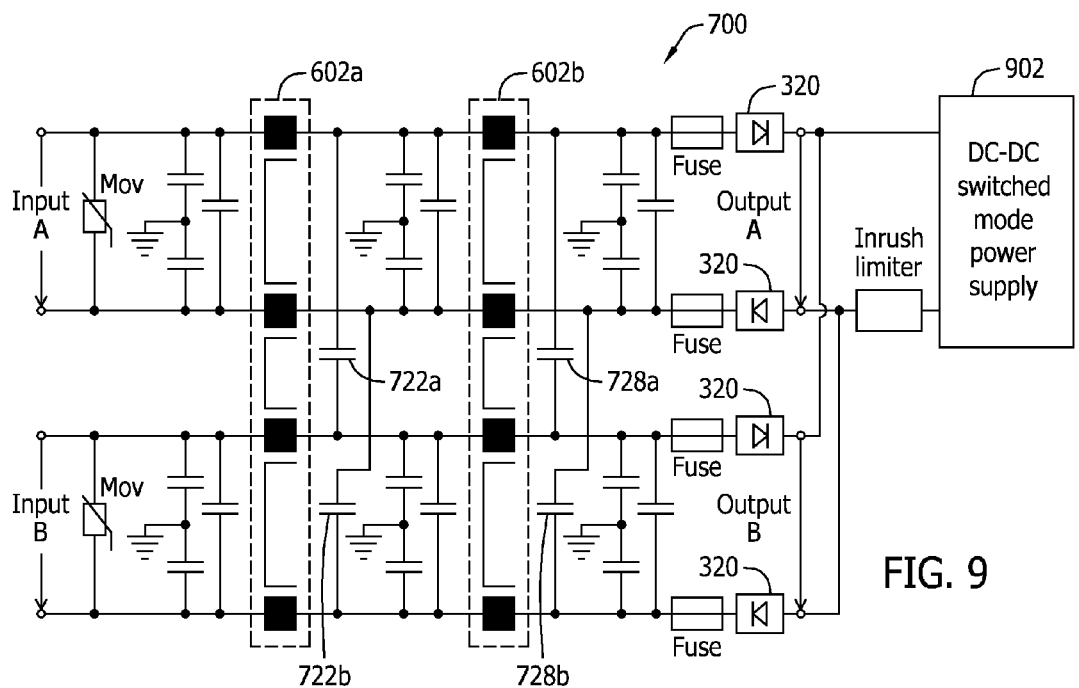
FIGS. 9-14 are circuit diagrams of the filter of FIG. 7 coupled to the input(s) of one or more DC-DC switched mode power supplies according to various embodiments.

As shown in the example of FIG. 9, the filter 700 may further include a metal-oxide varistor (MOV) coupled between each input A, B and the combined common mode choke 602a, one or more fuses coupled on the output side of the combined common mode choke 602b and an inrush current limiter coupled to the DC-DC switched mode power supply 902. Although the MOV, the one or more fuses and the inrush current limiter are shown in a specific position relative to other filter components, they may be positioned at any suitable location within the filter 700.

Additionally, in the example of FIG. 9, the inputs A, B of the filter 700 may be coupled to one or more power sources. For example, FIG. 10 illustrates the input A coupled to a power source A and FIG. 11 illustrates the inputs A, B coupled to power sources A, B, respectively.

Figure 10:
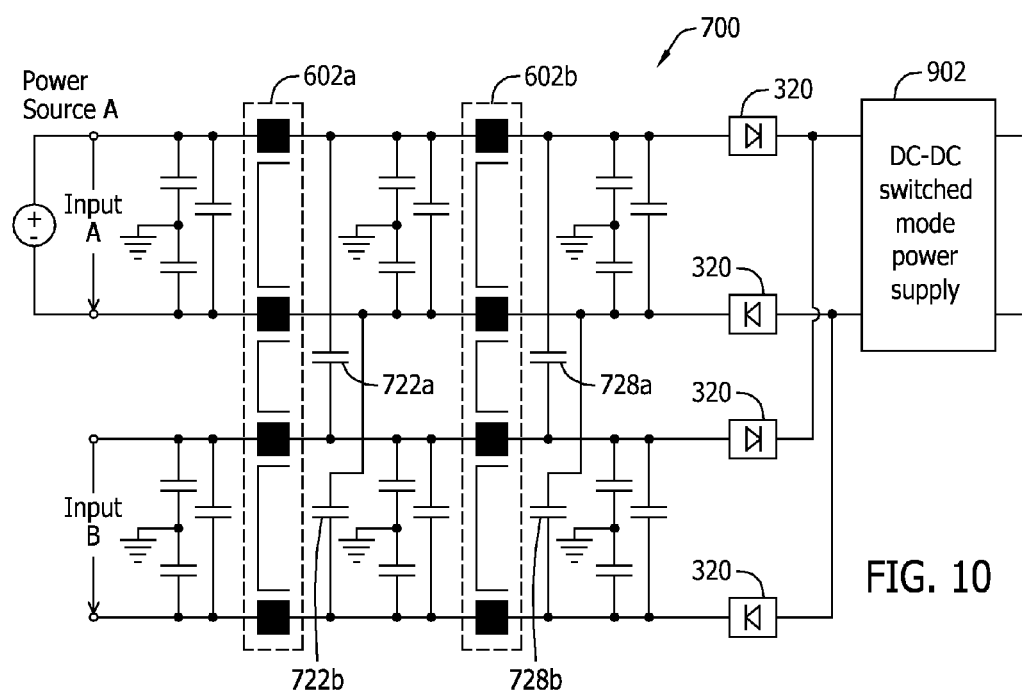

Referring to FIG. 10, when the power source A provides power to the DC-DC switched mode power supply 902, the reverse current protection devices 320 of the input A are on while the reverse current protection devices 320 of the input B are off. As explained above, this may lead to undesirable EMC performance which may be improved by the X-capacitors 722a, 722b, 728a, 728b.

Figure 11:
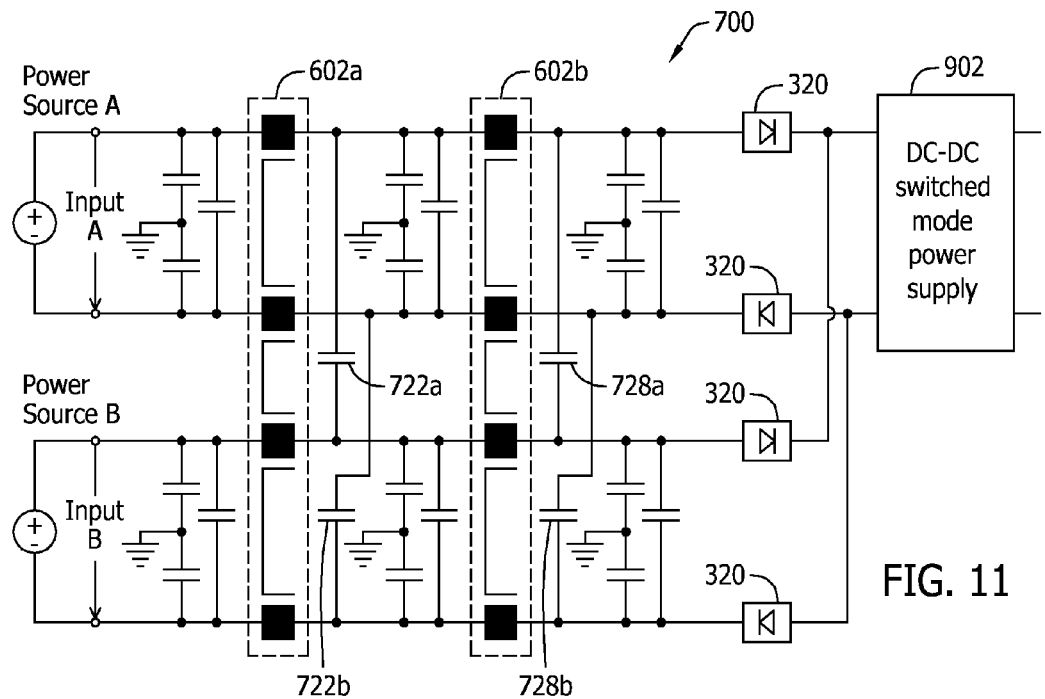

Referring to FIG. 11, the power source with the higher voltage provides the power for the DC-DC switched mode power supply 902. This may cause undesirable EMC performance because the reverse current protection devices 320 of the input with the higher voltage power source are on while the reverse current protection devices 320 of the input with the lower voltage power source are off. Accordingly, the X-capacitors 722a, 722b, 728a, 728b as described above are employed to achieve desirable EMC performance.

Figure 12:
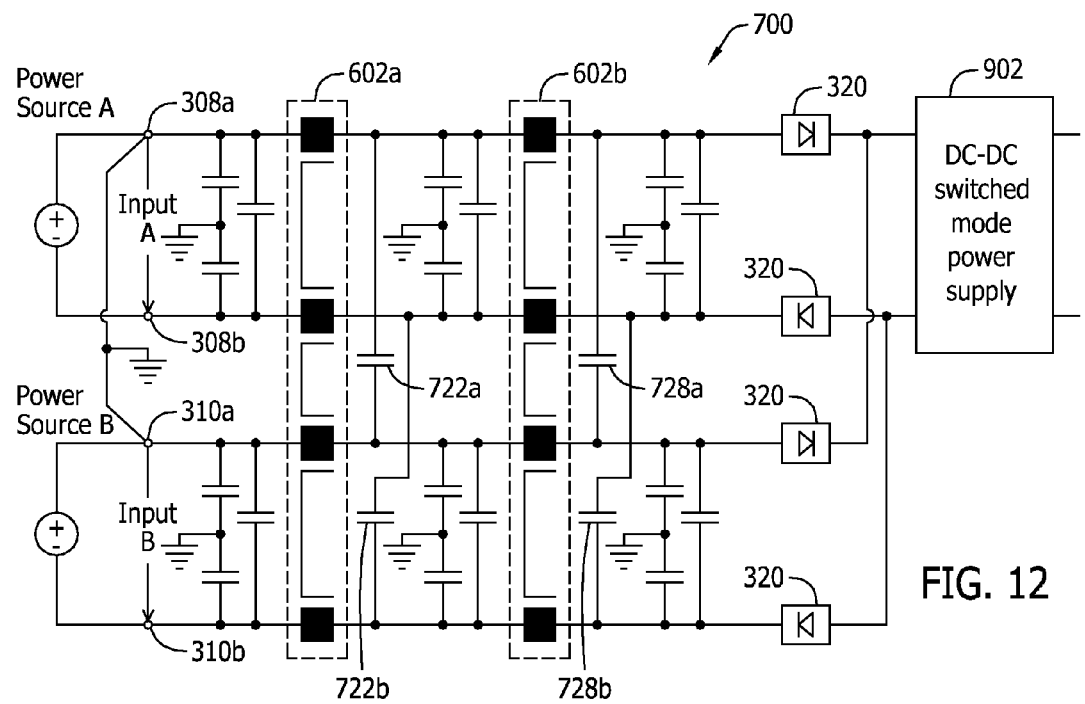

In other embodiments, one of more input terminals of the inputs A, B may be configured to couple to each other. For example, FIG. 12 illustrates the inputs A, B of the filter 700 coupled to power sources A, B, respectively. The input terminal 308a of the input A is coupled to the input terminal 310a of the input B and to the reference voltage. Thus, common current return paths of the filter 700 include the input terminals 308a, 310a.

In this case, the power source with the higher voltage provides the power for the DC-DC switched mode power supply 902. Therefore, the reverse current protection devices 320 of the input with the higher voltage power source are on. Additionally, the reverse current protection device 320 in the positive pole path of the input with the lower voltage power source is on due to the common current paths of the power sources A, B while the reverse current protection device 320 in the negative pole path of the input with the lower voltage power source is off. In this input configuration, the X-capacitors 722a, 722b, 728a, 728b as described above are employed to achieve desirable EMC performance.

Figure 13:
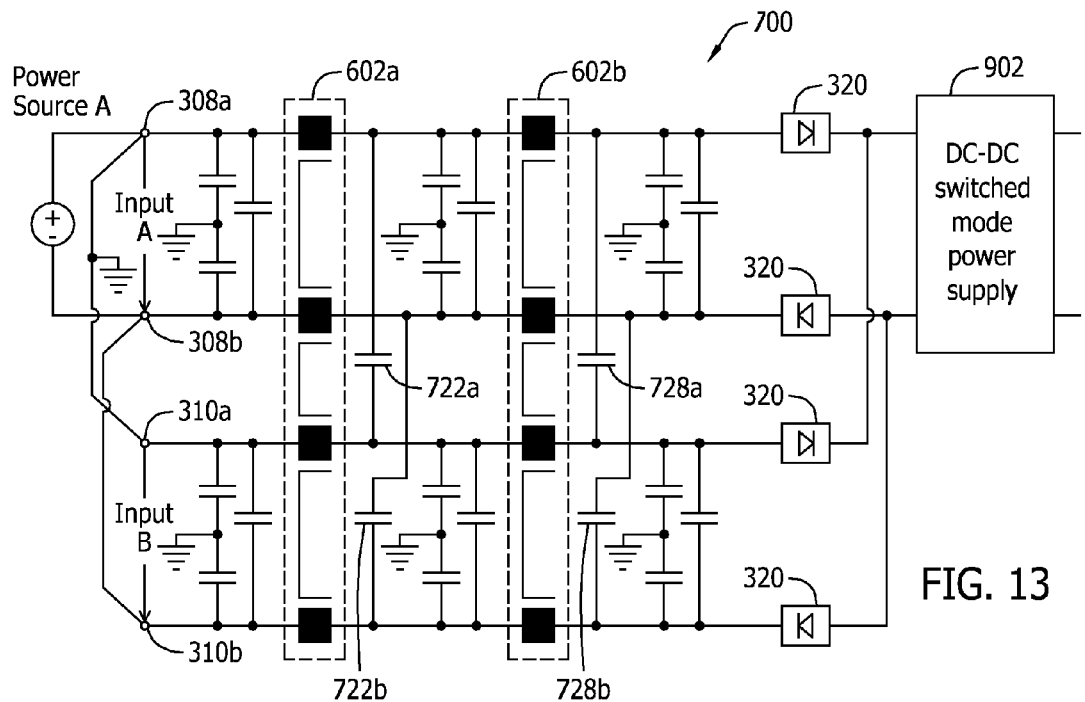

The example of FIG. 13 illustrates the inputs A, B of the filter 700 coupled to the power source A. The input terminal 308a is coupled to the input terminal 310a and the reference voltage while the input terminal 308b is coupled to the input terminal 310b. Thus, the inputs A, B are coupled in parallel.

In this input configuration, all reverse current protection devices 320 are on. Theoretically, if all reverse current protection devices 320 are on, the combined common mode chokes 602a, 602b and the X-capacitors 722a, 722b, 728a, 728b may not be needed to achieve desirable EMC performance. However, due to likely unequal resistance in the input paths, DC current will not distribute equally between the inputs A, B. The unequal resistance may be from the filter layout, varying temperatures, resistances of the reverse current protection devices (if ORing devices including MOSFETs are employed), a forward voltage drop of the reverse current protection (if diodes are employed), etc. Therefore, by employing the combined common mode chokes 602a, 602b, saturation caused by DC current distribution (as explained above with reference to FIG. 3) may be reduced (and in some cases eliminated).

As explained above, the DC-DC switched mode power supply 902 may be a noise source for conducted and/or radiated emission performance measured on the inputs A, B. Accordingly, the filter 700 of FIG. 13 includes the X-capacitors 722a, 722b, 728a, 728b to improve the conducted and/or radiated emission performance by compensating for unsymmetrical common mode noise levels (as explained above) between the combined common mode chokes 602a, 602b and between the combined common mode choke 602b and the reverse current protection devices 320. This ensures the combined common mode chokes 602a, 602b do not act as loaded transformers (as explained above).

In the example of FIG. 13, the unsymmetrical common mode noise levels may be caused, for example, by increased operating temperatures, tolerances of components in the filter 700, noise from components surrounding the filter 700, an unsymmetrical layout of the filter 700, etc. The unsymmetrical common mode noise levels may occur even though all reverse current protection devices 320 are conducting.

Figure 14:
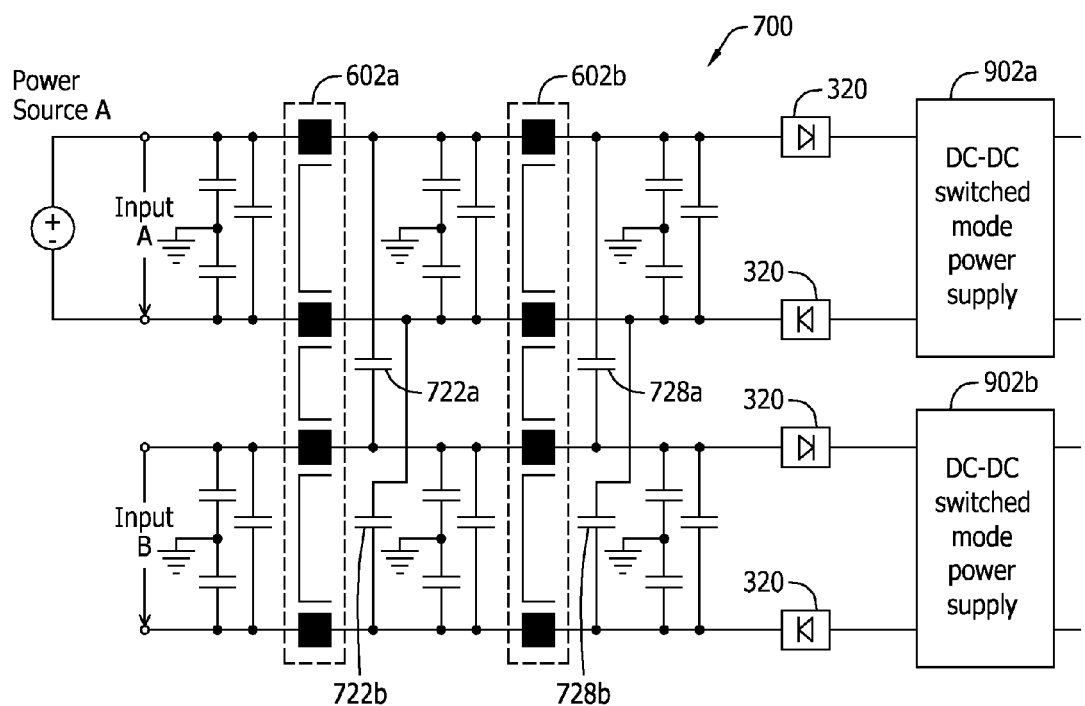

FIG. 14 illustrates the filter 700 of FIG. 7 coupled to independent DC-DC switched mode power supplies 902a, 902b. The filter 700 further includes the X-capacitors 722a, 722b, 728a, 728b (as explained above) to achieve desirable EMC performance.

Referring to FIGS. 9-14, additional X-capacitors (e.g., X-capacitors 822a, 822b of FIG. 8) may be coupled between the inputs A, B and the combined common mode choke 602a to ensure the combined common mode choke 602a does not act as a loaded transformer (as explained above) for conducted and/or radiated immunity requirements on the inputs A, B. Additionally, by employing additional X-capacitors, further advantages may be appreciated as explained above with respect to FIGS. 5 and 8.

FIGS. 15-21 illustrate a filter 1500 coupled to one or more DC-DC switched mode power supplies. As shown in FIGS. 15-21, the filter 1500 is an output filter for the one or more DC-DC switched mode power supplies. In the examples of FIGS. 15-21, the DC-DC switched mode power supplies may be a noise source for the emission performance measured on the outputs A, B.

The filter 1500 of FIGS. 15-21 includes the combined common mode chokes 602a, 602b and the X-capacitors 722a, 722b, 728a, 728b, 822a, 822b as described above with reference to FIG. 8 and additional X-capacitors 1522a, 1522b coupled on the output side of the reverse current protection devices 320. The X-capacitors 822a, 822b may compensate for unsymmetrical common mode noise levels on the inputs A, B due to different noise levels of the one or more DC-DC switched mode power supplies (e.g., due to different topologies, layouts, output loads, etc.) and to avoid a loaded transformer effect of the combined common mode choke 602a as explained above.

The X-capacitors 728a, 728b, 1522a, 1522b may bridge the reverse current protection devices 320 for common mode currents to compensate for unsymmetrical common mode noise levels on the outputs A, B which then may improve conducted and/or radiated emission performance.

Additionally, the X-capacitors 728a, 728b, 1522a, 1522b may ensure the combined common mode choke 602b does not act as a loaded transformer (as explained above) for conducted and/or radiated immunity requirements on the outputs A, B.

The X-capacitors 722a, 722b may ensure the combined common mode chokes 602a, 602b do not act as loaded transformers for conducted and/or radiated emissions and immunity performance as explained above.

Figure 15:
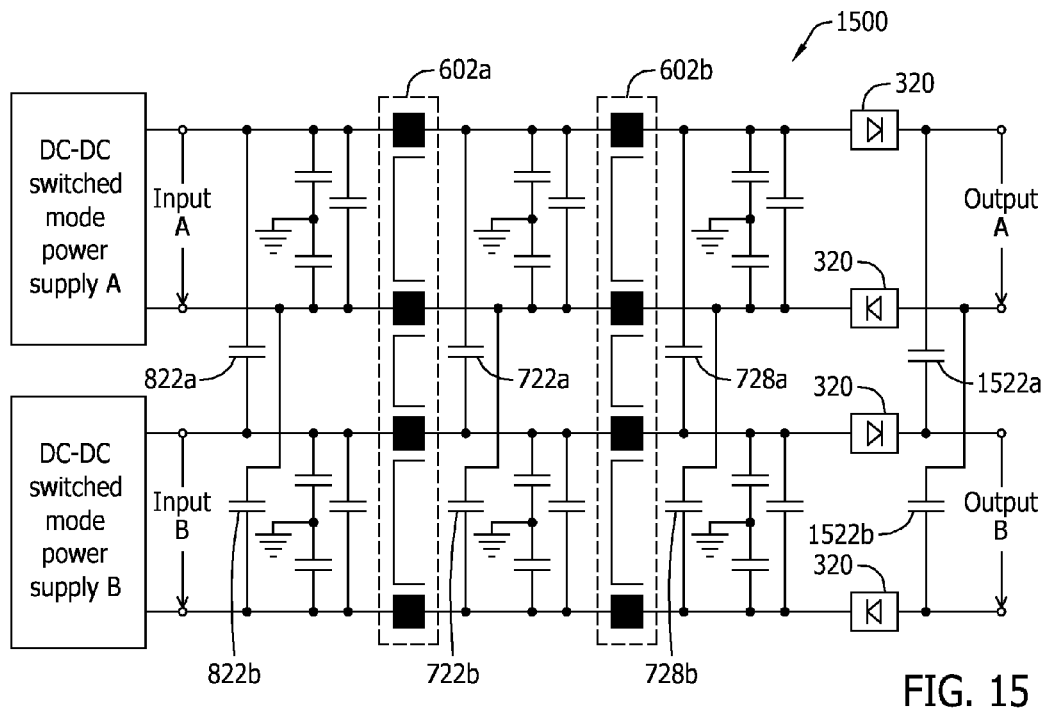
FIGS. 15-17 are circuit diagrams of power supply systems having output filters coupled to the output(s) of one or more DC-DC switched mode power supplies according to additional example embodiments.

The inputs A, B of the filter 1500 may be configured differently to couple to one or more DC-DC switched mode power supplies. For example, FIG. 15 illustrates the input A coupled to DC-DC switched mode power supply A and the input B coupled to DC-DC switched mode power supply B.

Figure 16:
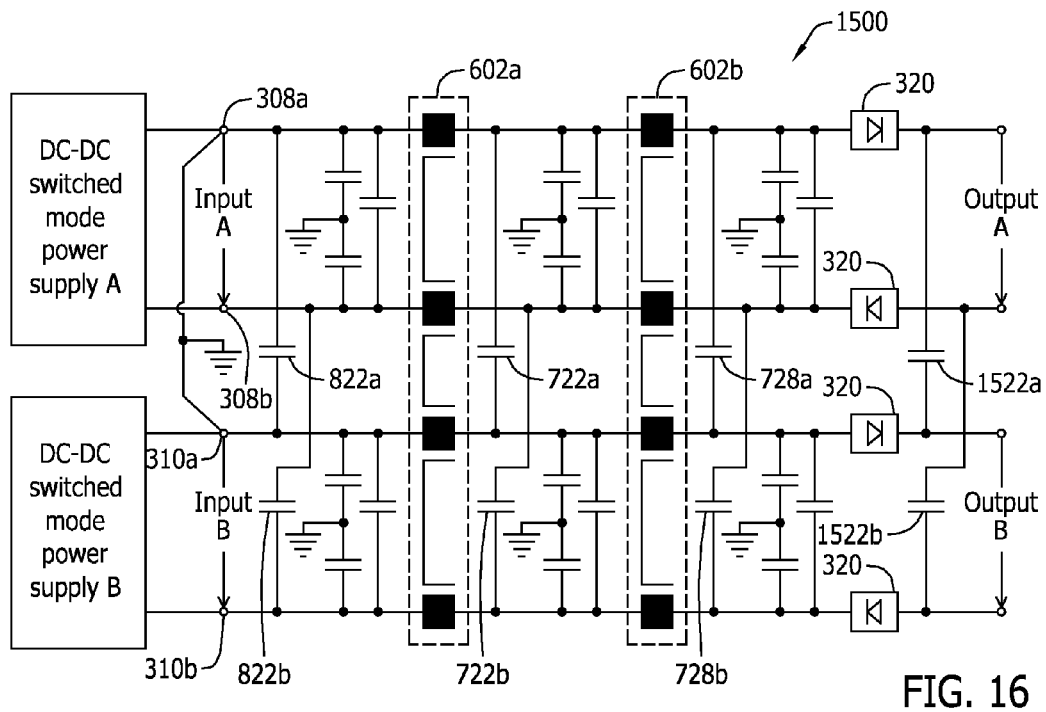
Figure 17:
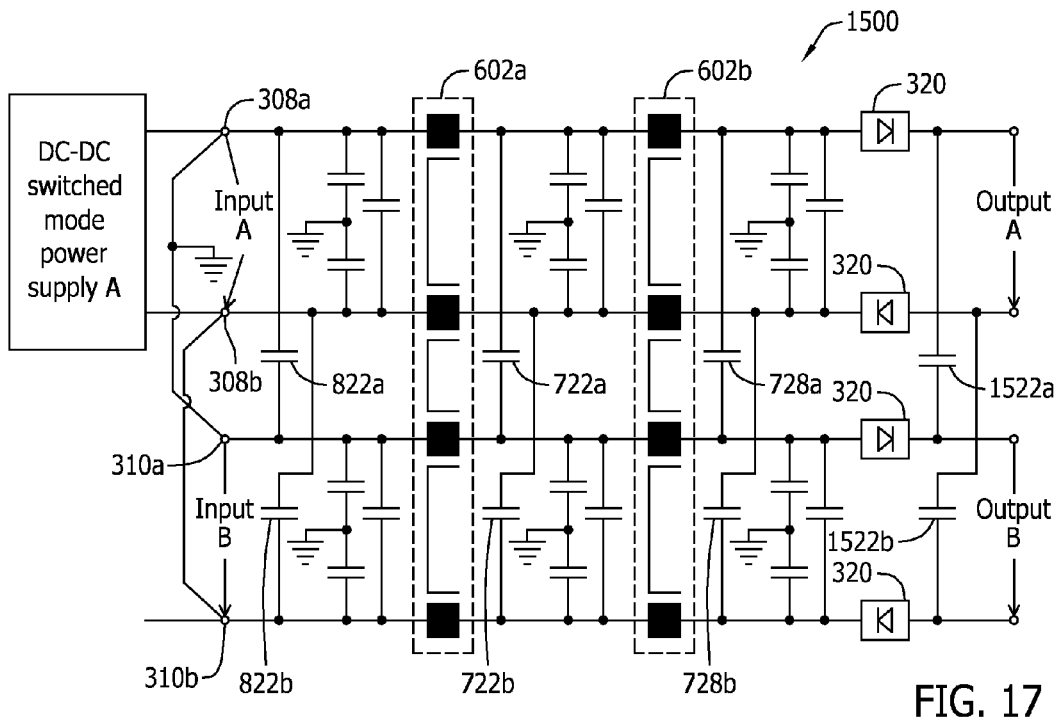

Alternatively, one of more input terminals of the inputs A, B may be coupled together. For example, FIG. 16 illustrates the input terminal 308a of the input A coupled to the input terminal 310a of the input B and the reference voltage. Alternatively, FIG. 17 illustrates the input terminal 308a of the input A and the input terminal 310a of the input B coupled to the reference voltage and the input terminal 308b of the input A coupled to the input terminal 310b of the input B. Thus, the inputs A, B of FIG. 17 are coupled in parallel.

Figure 18:
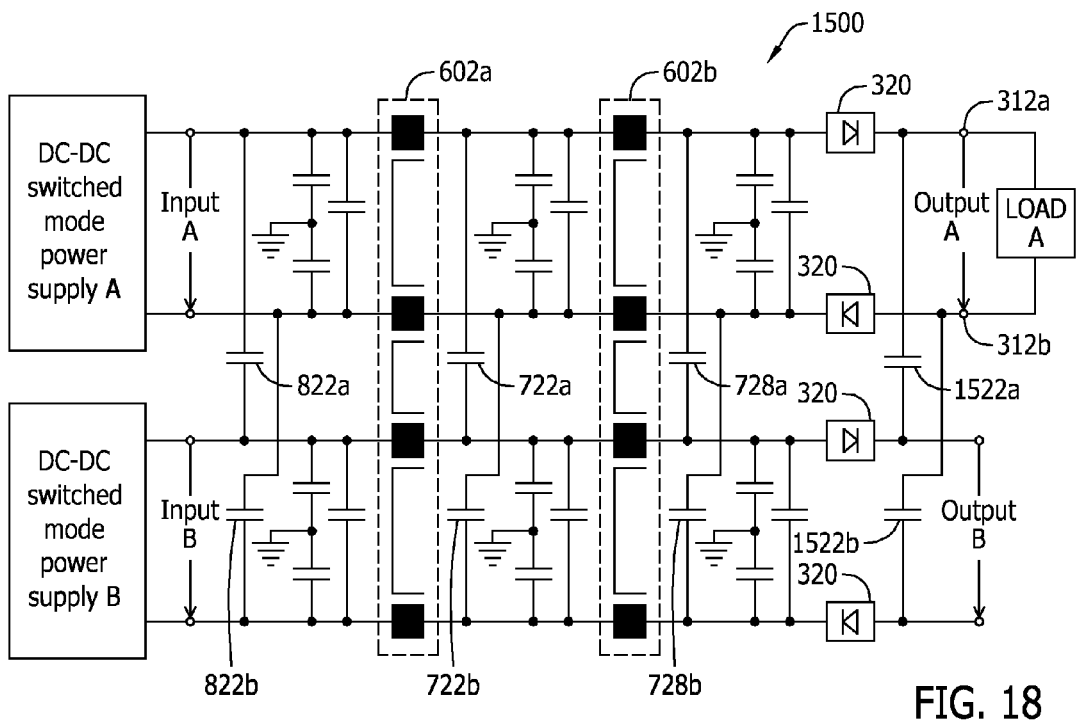
FIGS. 18-21 are circuit diagrams illustrating example load configurations for the power supply system of FIG. 15.
Figure 19:
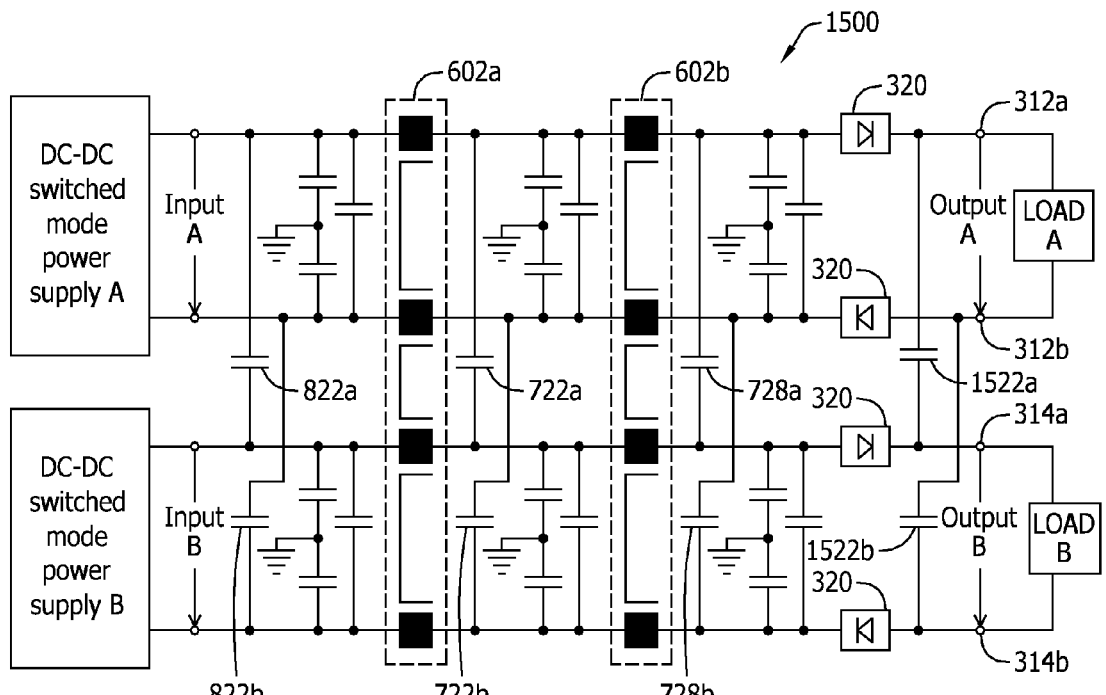

As shown in FIGS. 18-21, the filter 1500 may be configured to couple between at least one DC-DC switched mode power supply and at least one load. For example, FIG. 18 illustrates the filter 1500 coupled between DC-DC switched mode power supplies A, B and a load A while FIG. 19 illustrates the filter 1500 coupled between DC-DC switched mode power supplies A, B and loads A, B (i.e., the output A is coupled to load A and the output B is coupled to load B).

Figure 20:
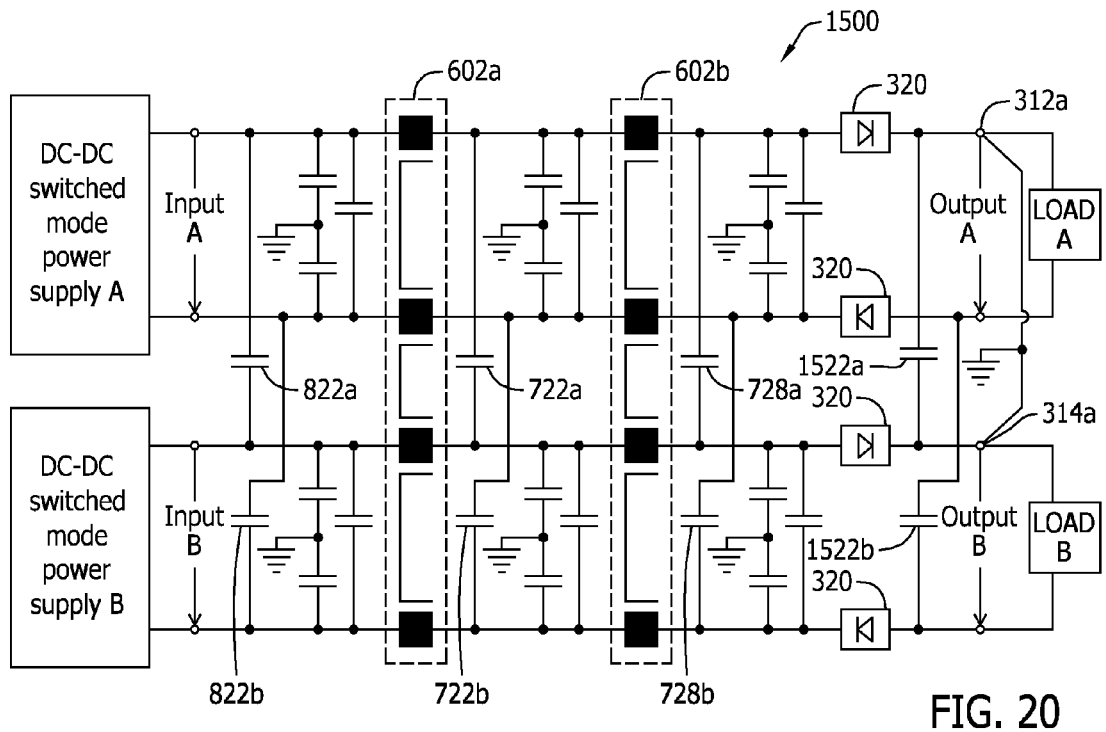
Figure 21:
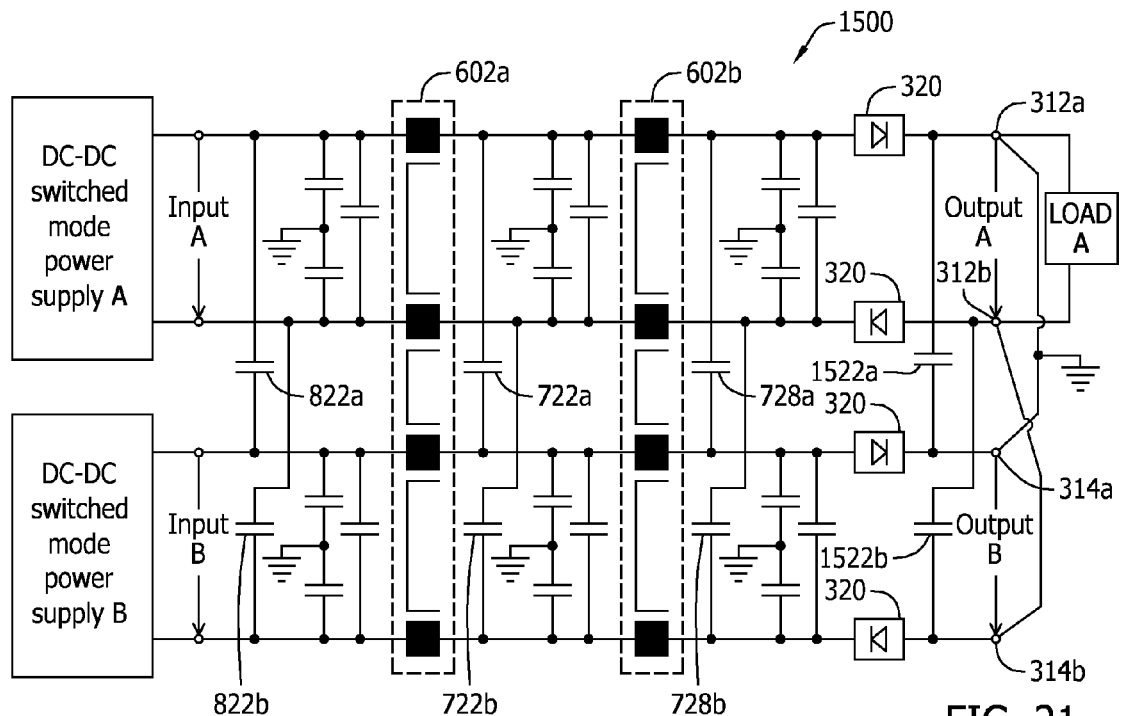

Further, as shown in FIGS. 20-21, one of more output terminals of the outputs A, B may be coupled together. For example, FIG. 20 illustrates the output terminal 312a of the output A coupled to the output terminal 314a of the output B and the reference voltage. Alternatively, FIG. 21 illustrates the output terminal 312a of the output A and the output terminal 314a of the output B coupled to the reference voltage and the output terminal 312b of the output A coupled to the output terminal 314b of the output B. Thus, the outputs A, B of FIG. 21 are coupled in parallel.

Although the reverse current protection devices 320 of FIGS. 3-21 are positioned on the output side of the combined common mode choke (e.g., the combined common mode choke 302 of FIGS. 3-5 and the combined common mode choke 602b of FIGS. 6-21), the reverse current protection devices 320 may be positioned at any suitable location. For example, FIG. 22 illustrates the reverse current protection devices 320 coupled between the combined common mode chokes 602a, 602b while FIG. 23 illustrates the reverse current protection devices 320 coupled on the input side of the combined common mode choke 602a.

Figure 22:
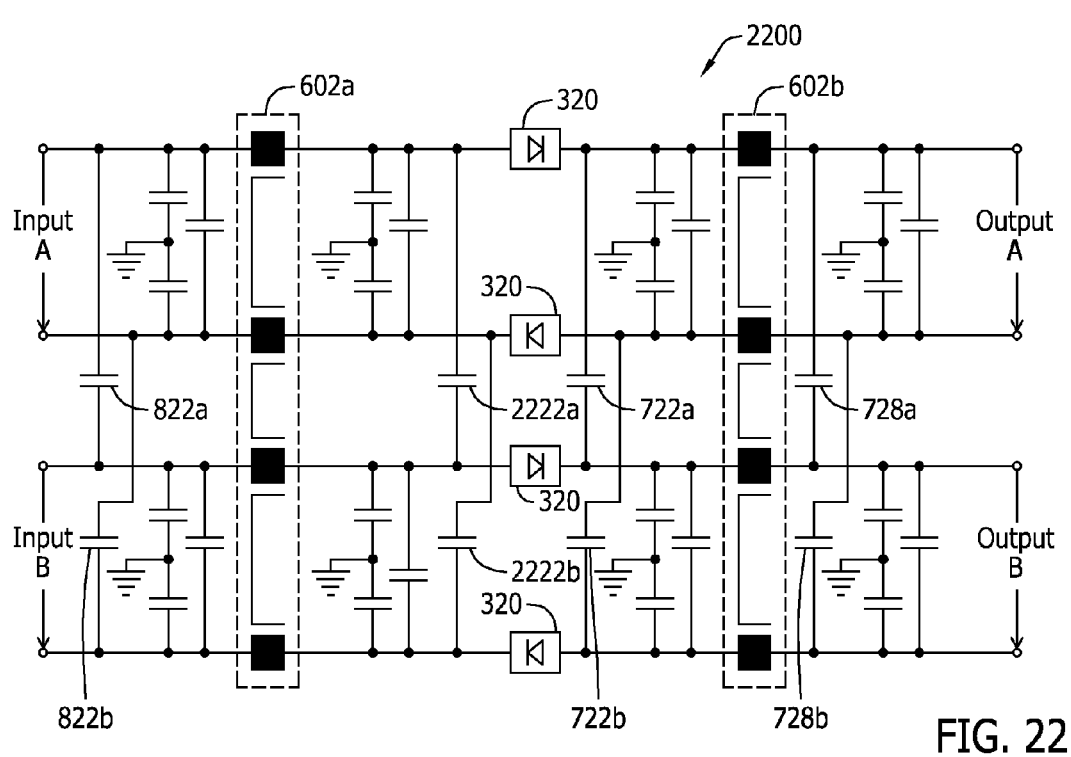
FIGS. 22 and 23 are circuit diagrams of filters for power supply systems according to further example embodiments.
Figure 23:
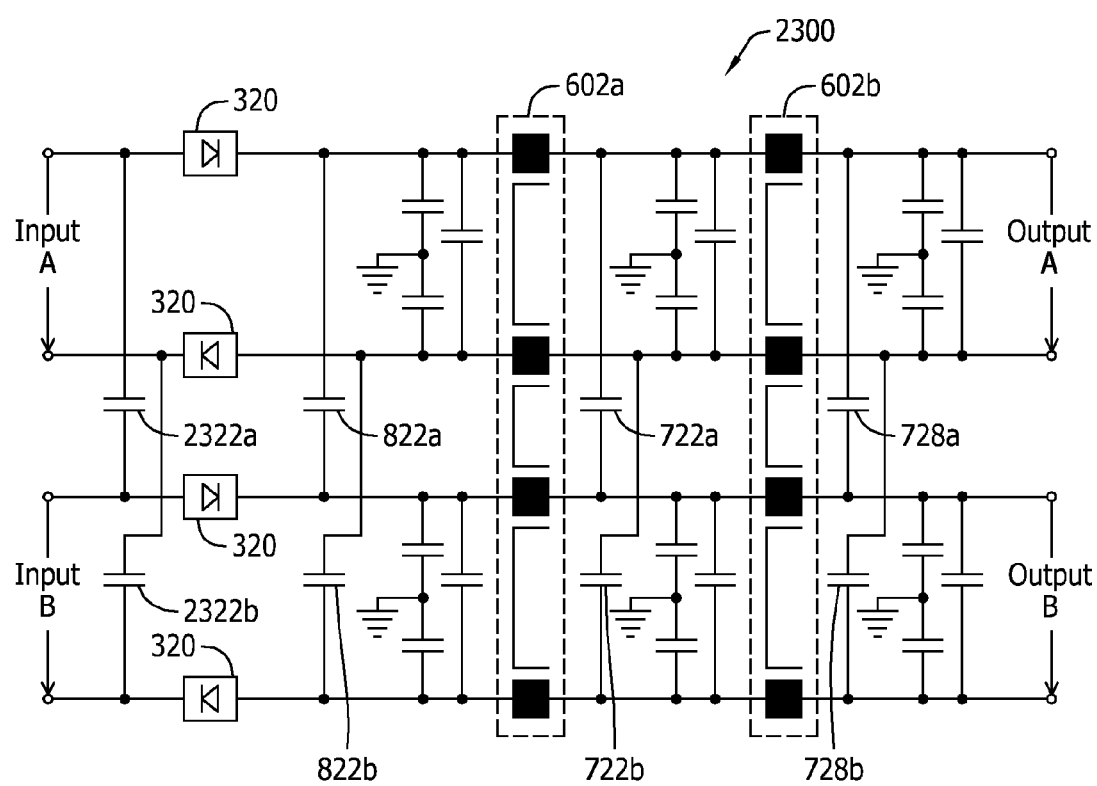

Referring to FIG. 22, a filter 2200 includes the combined common mode chokes 602a, 602b and the X-capacitors 722a, 722b, 728a, 728b, 822a, 822b of FIG. 8 and additional X-capacitors 2222a, 2222b coupled between the output side of the combined common mode choke 602a and the input side of the reverse current protection devices 320. The X-capacitors 722a, 722b, 728a, 728b, 822a, 822b include the similar advantages as described above.

Additionally, the X-capacitors 722a, 722b, 2222a, 2222b may bridge the reverse current protection devices 320 that are off for common mode currents to ensure the combined common mode chokes 602a, 602b do not act as loaded transformers (as explained above) for conducted and/or radiated immunity and emissions for noise sources on the inputs A, B and/or the outputs A, B.

The X-capacitors 822a, 822b ensure the combined common mode choke 602a does not act as a loaded transformer for noise sources coupled to the inputs A, B. Similarly, the X-capacitors 728a, 728b ensure the combined common mode choke 602b does not act as a loaded transformer for noise sources coupled to the outputs A, B. Additionally, the X-capacitors 728a, 728b and the X-capacitors 822a, 822b may improve conducted and/or radiated emission performance by compensating for unsymmetrical common mode noise levels at the inputs A, B and the outputs A, B, respectively, as explained above.

Referring to FIG. 23, a filter 2300 includes the combined common mode chokes 602a, 602b and the X-capacitors 722a, 722b, 728a, 728b, 822a, 822b of FIG. 8 and additional X-capacitors 2322a, 2322b coupled on the input side of the reverse current protection devices 320. The X-capacitors 722a, 722b include the same advantages as described above with reference to FIG. 7. The X-capacitors 728a, 728b include the same advantages as described above with reference to FIG. 22.

The X-capacitors 822a, 822b, 2322a, 2322b may bridge the reverse current protection devices 320 for common mode currents to compensate for unsymmetrical common mode noise levels on the inputs A, B. This may improve conducted and/or radiated emission performance on the inputs A, B when a noise source is coupled to one or more of the outputs A, B. Additionally, the X-capacitors 822a, 822b, 2322a, 2322b ensure the combined common mode choke 602a does not act as a loaded transformer (as explained above) for noise sources on the inputs A, B.

Figure 24:
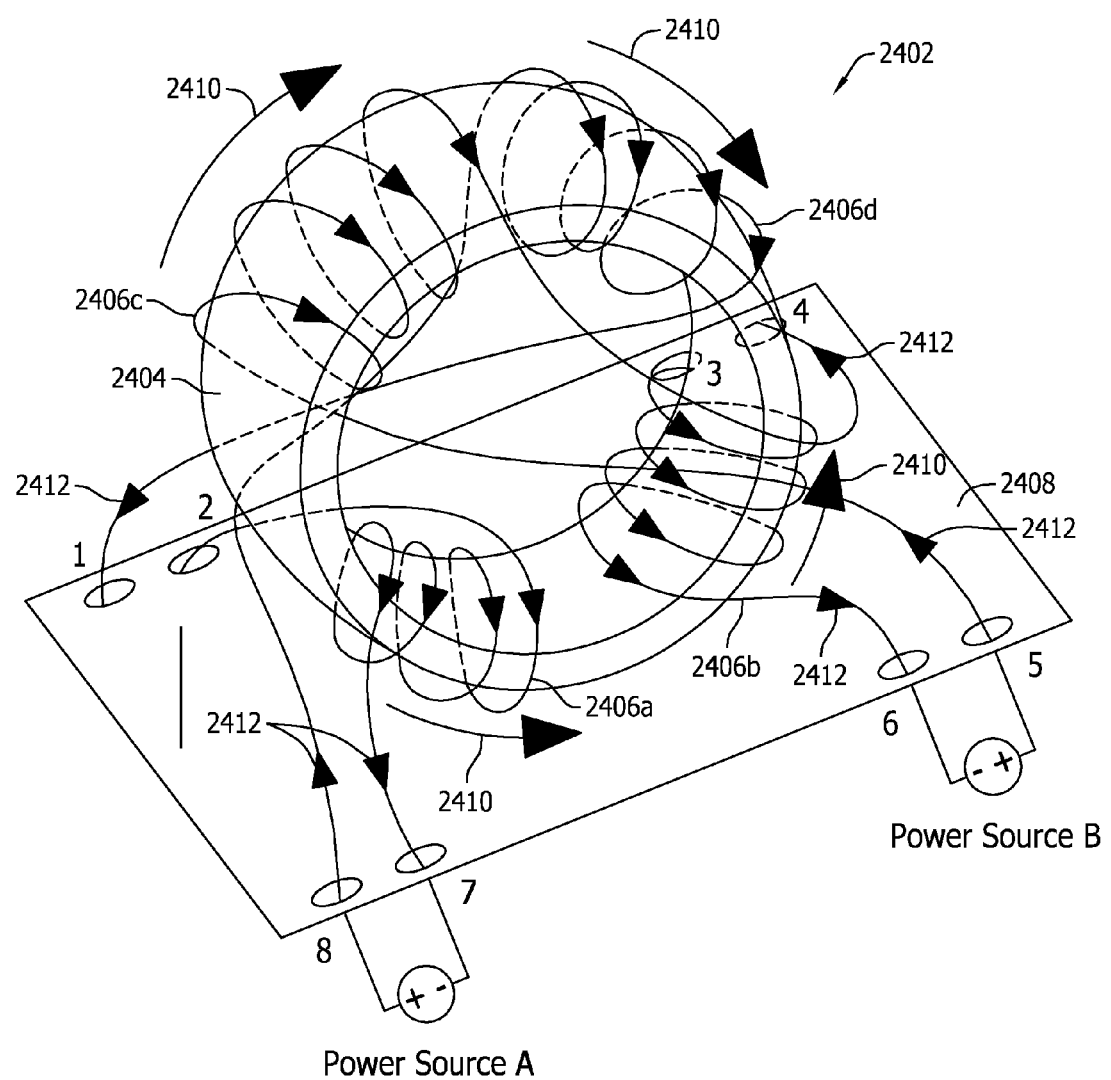
FIG. 24 is an isometric view of a combined common mode choke according to yet another example embodiment of the present disclosure.

By way of example, FIG. 24 illustrates an example combined common mode choke 2402 for a filter with two inputs and two outputs positioned on a base 2408 (e.g., a circuit board, etc.). The combined common mode choke 2402 includes a toroidal core 2404 and four windings 2406a, 2406b, 2406c, 2406d extending about the toroidal core 2404. In the example of FIG. 24, the windings 2406a, 2406b, 2406c, 2406d each include the same number of turns. As shown in FIG. 24, arrows 2410 represent DC flux generated by DC current (indicated by arrows 2412) in the windings 2406a, 2406b, 2406c, 2406d. In the example of FIG. 24, the sum of the DC fluxes of the combined common mode choke 2402 is substantially zero.

Although FIGS. 1-23 illustrate a filter including two inputs A, B and two outputs A, B, it should be understood that more or less than two inputs and two outputs may be employed in other embodiments. In addition, the filter disclosed herein may include additional filter components, including. e.g., one or more differential mode chokes, components to improve radiated emissions, etc., to comply with immunity noise requirements.

Additionally, although FIGS. 3-21 illustrate a particular filter coupled to one or more DC-DC switched mode power supplies, the filters disclosed herein may be coupled to any suitable power supply or power supplies, including, for example, an AC-DC power supply, a DC-AC power supply, etc. Further, although the figures illustrate a filter coupled to one or more power supplies, the power supply may include the filter.

In addition, although the example filters disclosed herein include a particular number of X-capacitors and combined common mode chokes, any suitable number of X-capacitors and combined common mode chokes may be employed depending on the configuration of the filter (e.g., the number of combined common mode chokes used, position of the reverse current protection devices, if the filter is used as input filter or output filter, etc.) and the desired EMC performance. Further, the X-capacitors may be employed at any suitable location (e.g., on an input or output side of reverse current protection devices, on an input or output side of a combined common mode choke, etc.) depending on the configuration of the filter and desired EMC performance.

The X-capacitors and the Y-capacitors disclosed herein may be any suitable capacitor including, for example, ceramic capacitors, foil capacitors, etc. and may include any suitable mounting configuration, including for example, surface mount, radial leads, etc. Further, any suitable capacitance value of the capacitors may be employed to achieve a desired conducted and/or radiated emissions and conducted and/or radiated immunity, and thereby a desired electromagnetic compatibility (EMC) performance.

The magnetic cores disclosed herein may include an EI core configuration, EE core configuration, a toroidal core configuration, or any other suitable core configuration. Additionally, the windings disclosed herein may be wound about the magnetic cores in any suitable winding technique including, e.g., a winding technique that delivers a higher stray inductance that may damp differential mode noise. Further, in some embodiments, windings of each particular filter disclosed herein include the same number of turns, or alternatively, a different number of turns.

As apparent to those skilled in the art, the filters described herein may reduce conducted emissions and thereby improve EMC performance for various input configurations as explained above. The filters may also improve radiated emission performance through components (e.g., cables, etc.) coupled to an input and/or an output of a particular filter. Further, the filters may improve conducted and/or radiated immunity performance of a device (e.g., a power supply) coupled to the input and/or the output of one or more filters by blocking disturbances generated externally of the device.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A filter for a power supply, the filter comprising:
   at least two inputs, each input including a pair of input terminals;
   at least two outputs, each output including a pair of output terminals;
   a pair of X-capacitors including a first X-capacitor and a second X-capacitor, each X-capacitor having a first terminal and a second terminal, the first terminal of the first X-capacitor coupled between one input terminal of the pair of input terminals of one of the at least two inputs and one output terminal of the pair of output terminals of one of the at least two outputs, the second terminal of the first X-capacitor coupled between one input terminal of the pair of input terminals of another one of the at least two inputs and one output terminal of the pair of output terminals of another one of the at least two outputs, the first terminal of the second X-capacitor coupled between another input terminal of the pair of input terminals of said one of the at least two inputs and another output terminal of the pair of output terminals of said one of the at least two outputs, the second terminal of the second X-capacitor coupled between another input terminal of the pair of input terminals of said another one of the at least two inputs and another output terminal of the pair of output terminals of said another one of the at least two outputs, and a common mode choke coupled between the at least two inputs and the at least two outputs, the common mode choke including a magnetic core and at least four windings extending about the magnetic core, each winding coupled between a different one of the pair of input terminals of each of the at least two inputs and a different one of the pair of output terminals of each of the at least two outputs than the other windings of the common mode choke.

2. The filter of claim 1 wherein the pair of X-capacitors are coupled between the common mode choke and the at least two outputs.

3. The filter of claim 1 wherein said common mode choke is a first common mode choke, the filter further comprising a second common mode choke, the second common mode choke including a second magnetic core and at least four windings extending about the second magnetic core, each winding of the second common mode choke coupled between a different one of the pair of input terminals of each of the at least two inputs and a different one of the pair of output terminals of each of the at least two outputs than the other windings of the second common mode choke.

4. The filter of claim wherein said pair of X-capacitors are a first pair of X-capacitors, wherein the first pair of X-capacitors are coupled between the common mode choke and the at least two outputs, the filter further comprising a second pair of X-capacitors, each X-capacitor of the second pair of X-capacitors including a pair of terminals, one terminal of each X-capacitor of the second pair of X-capacitors coupled between said one of the at least two inputs and the common mode choke, the other terminal of each X-capacitor of the second pair of X-capacitors coupled between said another one of the at least two inputs and the common mode choke.

5. The filter of claim 4 wherein said common mode choke is a first common mode choke, the filter further comprising a second common mode choke, the second common mode choke including a second magnetic core and at least four windings extending about the second magnetic core, each winding of the second common mode choke coupled between a different one of the input pair of input terminals of each of the at least two inputs and a different one of the pair of output terminals of each of the at least two outputs than the other windings of the second common mode choke.

6. The filter of claim 5 further comprising a third pair of X-capacitors, each X-capacitor of the third pair of X-capacitors including a pair of terminals, one terminal of each X-capacitor of the third pair of X-capacitors coupled between said one of the at least two inputs and the second common mode choke, the other terminal of each X-capacitor of the third pair of X-capacitors coupled between said another one of the at least two inputs and the second common mode choke.

7. The filter of claim 1 further comprising a first plurality of capacitors coupled between the pair of input terminals of said one of the at least two inputs, a second plurality of capacitors coupled between the pair of input terminals of said another one of the at least two inputs, a third plurality of capacitors coupled between the pair of output terminals of said one of the at least two outputs, and a fourth plurality of capacitors coupled between the pair of output terminals of said another one of the at least two outputs, the first, second, third and fourth plurality of capacitors each including at least one X-capacitor and at least one Y-capacitor.

8. The filter of claim 1 further comprising at least one reverse current protection device coupled to the common mode choke.

9. A system comprising:
a power supply including an input; and
an input filter having at least two inputs, at least two outputs, a pair of X-capacitors including a first X-capacitor and a second X-capacitor, and a common mode choke coupled between the at least two inputs and the at least two outputs, each input of the input filter including a pair of input terminals, each output including a pair of output terminals, each X-capacitor having a first terminal and a second terminal, the first terminal of the first X-capacitor coupled between one input terminal of the pair of input terminals of one of the at least two inputs and one output terminal of the pair of output terminals of one of the at least two outputs, the second terminal of the first X-capacitor coupled between one input terminal of the pair of input terminals of another one of the at least two inputs and one output terminal of the pair of output terminals of another one of the at least two outputs, the first terminal of the second X-capacitor coupled between another input terminal of the pair of input terminals of said one of the at least two inputs and another output terminal of the pair of output terminals of said one of the at least two outputs, the second terminal of the second X-capacitor coupled between another input terminal of the pair of input terminals of said another one of the at least two inputs and another output terminal of the pair of output terminals of said another one of the at least two outputs, the common mode choke including a magnetic core and at least four windings extending about the magnetic core, each winding coupled between a different one of the pair of input terminals of each of the at least two inputs and a different one of the pair of output terminals of each of the at least two outputs than the other windings of the common mode choke of the input filter, at least one of the at least two outputs of the input filter coupled to the input of the power supply.

10. The system of claim 9 wherein the pair of X-capacitors are coupled between the common mode choke and the at least two outputs.

11. The system of claim 9 wherein said pair of X-capacitors are a first pair of X-capacitors, wherein the first pair of X-capacitors are coupled between the common mode choke and the at least two outputs, the input filter further comprising a second pair of X-capacitors, each X-capacitor of the second pair of X-capacitors including a pair of terminals, one terminal of each X-capacitor of the second pair of X-capacitors coupled between said one of the at least two inputs and the common mode choke, the other terminal of each X-capacitor of the second pair of X-capacitors coupled between said another one of the at least two inputs and the common mode choke.

12. The system of claim 11 wherein the common mode choke is a first common mode choke, the input filter further comprising a second common mode choke, the second common mode choke including a second magnetic core and at least four windings extending about the second magnetic core, each winding of the second common mode choke coupled between a different one of the pair of input terminals of each of the at least two inputs and a different one of the pair of output terminals of each of the at least two outputs than the other windings of the second common mode choke.

13. The system of claim 12 further comprising a power source coupled to at least one of the at least two inputs of the input filter.

14. The system of claim 13 wherein the at least two inputs of the input filter are coupled in parallel.

15. The system of claim 13 wherein the power source is a first power source, the system further comprising a second power source coupled to said another one of the at least two inputs of the input filter.

16. The system of claim 15 wherein one input terminal of each of the at least two inputs is coupled to a reference voltage.

17. The system of claim 12 wherein said another one of the at least two outputs of the input filter is coupled to the input of the power supply.

18. The system of claim 12 wherein the power supply is a first power supply, the system further comprising a second power supply, wherein said another one of the at least two outputs of the input filter is coupled to the second power supply.

19. A system comprising:
a power supply including an output, and
an output filter having at least two inputs, at least two outputs, a pair of X-capacitors including a first X-capacitor and a second X-capacitor, and a common mode choke coupled between the at least two inputs and the at least two outputs, each input including a pair of input terminals, each output of the output filter including a pair of output terminals, each X-capacitor having a first terminal and a second terminal, the first terminal of the first X-capacitor coupled between one input terminal of the pair of input terminals of one of the at least two inputs and one output terminal of the pair of output terminals of one of the at least two outputs, the second terminal of the first X-capacitor coupled between one input terminal of the pair of input terminals of another one of the at least two inputs and one output terminal of the pair of output terminals of another one of the at least two outputs, the first terminal of the second X-capacitor coupled between another input terminal of the pair of input terminals of said one of the at least two inputs and another output terminal of the pair of output terminals of said one of the at least two outputs, the second terminal of the second X-capacitor coupled between another input terminal of the pair of input terminals of said another one of the at least two inputs and another output terminal of the pair of output terminals of said another one of the at least two outputs, the common mode choke including a magnetic core and at least four windings extending about the magnetic core, each winding coupled between a different one of the pair of input terminals of each of the at least two inputs and a different one of the pair of output terminals of each of the at least two outputs than the other windings of the common mode choke of the output filter, at least one of the at least two inputs of the output filter coupled to the output of the power supply.

20. The system of claim 19 wherein the pair of X-capacitors are coupled between the common mode choke and the at least two outputs.

21. The system of claim 19 wherein the common mode choke is a first common mode choke, the output filter further comprising a second common mode choke, the second common mode choke including a second magnetic core and at least four windings extending about the second magnetic core, each winding of the second common mode choke coupled between a different one of the pair of input terminals of each of the at least two inputs and a different one of the pair of output terminals of each of the at least two outputs than the other windings of the second common mode choke.

22. The system of claim 21 wherein said another one of the at least two inputs of the output filter is coupled to the output of the power supply.

23. The system of claim 22 wherein the at least two inputs of the output filter are coupled in parallel.

24. The system of claim 21 wherein the power supply is a first power supply, the system further comprising a second power supply, wherein said another one of the at least two inputs of the output filter is coupled to the second power supply.

25. The system of claim 24 wherein one input terminal of each of the at least two inputs is coupled to a reference voltage.

26. The system of claim 21 wherein the at least two outputs of the output filter are coupled in parallel.

27. The system of claim 21 wherein one output terminal of each of the at least two outputs of the output filter is coupled to a reference voltage.

* * * * *

UNITED STATES PATENT AND TRADEMARK OFFICE
CERTIFICATE OF CORRECTION

| | |
|---|---|
| PATENT NO. | : 9,203,296 B2 |
| APPLICATION NO. | : 13/799810 |
| DATED | : December 1, 2015 |
| INVENTOR(S) | : Fauer et al. |

It is certified that error appears in the above-identified patent and that said Letters Patent is hereby corrected as shown below:

In The Claims

At column 13, line 39, please replace "claim" with "claim 1."

Signed and Sealed this
Twenty-third Day of August, 2016

Michelle K. Lee
*Director of the United States Patent and Trademark Office*